United States Patent
Niitsuma et al.

(10) Patent No.: US 9,922,841 B2
(45) Date of Patent: Mar. 20, 2018

(54) PLASMA PROCESSING METHOD

(71) Applicant: TOKYO ELECTRON LIMITED, Tokyo (JP)

(72) Inventors: Ryosuke Niitsuma, Miyagi (JP); Haruto Kanamori, Miyagi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 0 days.

(21) Appl. No.: 14/959,049

(22) Filed: Dec. 4, 2015

(65) Prior Publication Data
US 2016/0172212 A1 Jun. 16, 2016

(30) Foreign Application Priority Data
Dec. 10, 2014 (JP) .................... 2014-249685

(51) Int. Cl.
| H01L 21/302 | (2006.01) |
| H01L 21/461 | (2006.01) |
| C03C 15/00 | (2006.01) |
| C03C 25/68 | (2006.01) |
| C23F 1/00 | (2006.01) |
| B44C 1/22 | (2006.01) |
| H01L 21/311 | (2006.01) |
| H01J 37/32 | (2006.01) |
| H01L 21/3065 | (2006.01) |
| H01L 21/3213 | (2006.01) |

(52) U.S. Cl.
CPC .. *H01L 21/31116* (2013.01); *H01J 37/32027* (2013.01); *H01J 37/32467* (2013.01); *H01L 21/3065* (2013.01); *H01L 21/31138* (2013.01); *H01L 21/32136* (2013.01); *H01L 21/32137* (2013.01); *H01L 21/32139* (2013.01)

(58) Field of Classification Search
None
See application file for complete search history.

(56) References Cited

U.S. PATENT DOCUMENTS

| 6,527,968 | B1 * | 3/2003 | Wang | H01J 37/321 134/1.1 |
| 6,872,322 | B1 * | 3/2005 | Chow | H01J 37/32862 134/1.1 |
| 2001/0052350 | A1 * | 12/2001 | Chow | H01J 37/32862 134/1.1 |
| 2004/0221797 | A1 * | 11/2004 | Mosden | H01J 37/32082 117/84 |
| 2007/0131652 | A1 * | 6/2007 | Okune | H01J 37/321 216/67 |

(Continued)

FOREIGN PATENT DOCUMENTS

JP 2006-270018 A 10/2006

*Primary Examiner* — Stephanie P Duclair
(74) *Attorney, Agent, or Firm* — Rothwell, Figg, Ernst & Manbeck, P.C.

(57) ABSTRACT

A plasma processing method uses a plasma processing apparatus including a processing chamber, a mounting table provided in the processing chamber and configured to support a target object, and a ceiling member made of silicon and provided above the mounting table. The plasma processing method includes loading the target object into the processing chamber and generating a plasma of a processing gas containing chlorine gas and oxygen gas in the processing chamber.

7 Claims, 9 Drawing Sheets

(56) References Cited

U.S. PATENT DOCUMENTS

2007/0275564 A1\* 11/2007 Harada ............... H01L 21/0273
  438/706
2011/0244691 A1\* 10/2011 Mochiki ........... H01J 37/32091
  438/710

\* cited by examiner

PLASMA PROCESSING METHOD

CROSS-REFERENCE TO RELATED APPLICATIONS

This application claims priority to Japanese Patent Application No. 2014-249685 filed on Dec. 10, 2014, the entire contents of which are incorporated herein by reference.

Field of the Invention

The disclosure relates to a plasma processing method.

Background of the Invention

In manufacturing an electronic device such as a semiconductor device, a plasma processing is performed by using a plasma processing apparatus. The plasma processing is, e.g., etching of an insulating film such as a silicon oxide film.

A plasma processing apparatus disclosed in, e.g., Japanese Patent Application Publication No. 2006-270018, is known as a plasma processing apparatus used for etching an insulating film. The plasma processing apparatus disclosed in Japanese Patent Application Publication No. 2006-270018 includes a processing chamber, a mounting table and a ceiling member. The mounting table is provided in the processing chamber and configured to support a target object in the processing chamber. The ceiling member is made of silicon and provided above the mounting table to face the mounting table. In this plasma processing apparatus, the mounting table serves as a lower electrode and the ceiling member serves as an upper electrode.

In the plasma processing apparatus disclosed in Japanese Patent Application Publication No. 2006-270018, in order to etch an insulating film, a processing gas containing fluorocarbon is supplied into the processing chamber and a plasma of the processing gas is generated. The insulating film is etched by active species produced by the plasma generation.

The above plasma processing apparatus may be required to etch a film, e.g., an amorphous silicon film or a polycrystalline silicon film, other than the insulating film. As for a processing gas used for etching a film other than the insulating film, a processing gas containing chlorine gas may be used. However, in the case of using such processing gas, the ceiling member is etched. When the ceiling member is etched in a state where foreign substances such as silicon oxide or the like are adhered as a micro mask to the ceiling member, a surface of the ceiling member becomes uneven.

Therefore, it is required to suppress etching of the ceiling member made of silicon in the plasma processing using the processing gas containing chlorine gas.

SUMMARY OF THE INVENTION

In accordance with an aspect, there is provided a plasma processing method using a plasma processing apparatus including a processing chamber, a mounting table provided in the processing chamber and configured to support a target object, and a ceiling member made of silicon and provided above the mounting table. The plasma processing method includes loading the target object into the processing chamber and generating a plasma of a processing gas containing chlorine gas and oxygen gas in the processing chamber.

BRIEF DESCRIPTION OF THE DRAWINGS

The objects and features of the disclosure will become apparent from the following description of embodiments, given in conjunction with the accompanying drawings, in which.

DETAILED DESCRIPTION OF THE EMBODIMENTS

Figure 1:
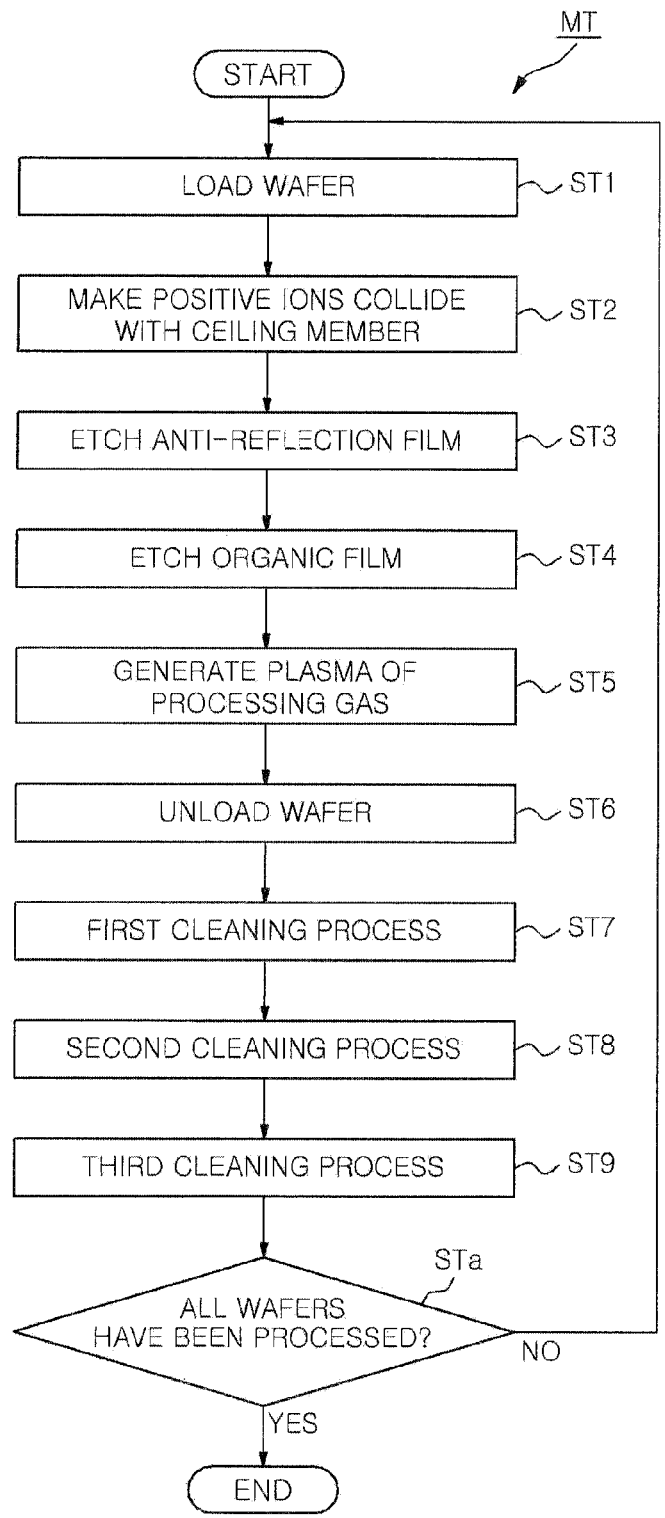
FIG. 1 is a flowchart showing a plasma processing method according to an embodiment.

Hereinafter, various embodiments will be described in detail with reference to the accompanying drawings. Like reference numerals will be used for like or corresponding parts throughout the drawings.

Figure 2:
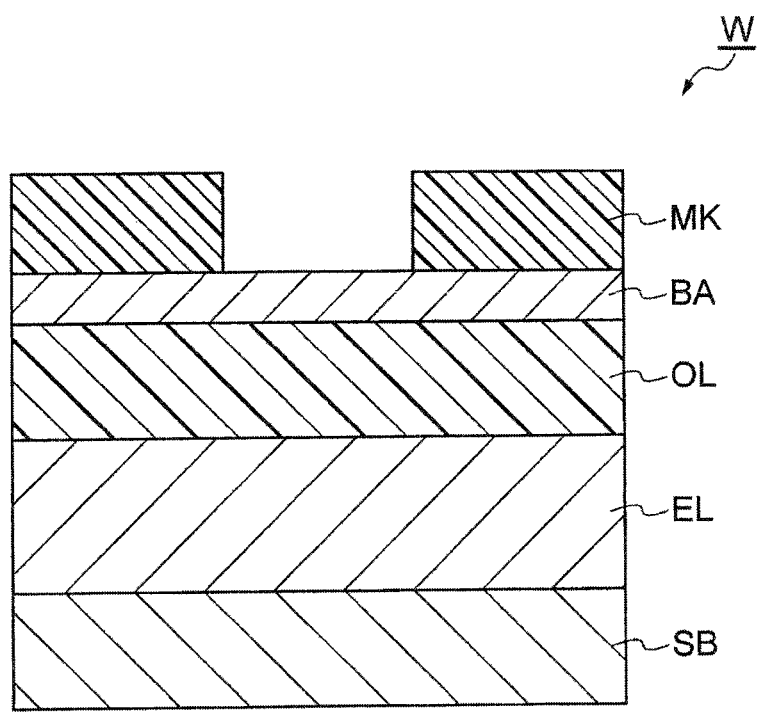
FIG. 2 is a cross sectional view showing an example of a target object to which the plasma processing method shown in FIG. 1 is applied.

FIG. 1 is a flowchart showing a plasma processing method according to an embodiment. A method MT shown in FIG. 1 is a plasma processing method using a plasma processing apparatus including a ceiling member made of silicon. FIG. 2 is a cross sectional view showing an example of a target object (hereinafter, referred to as "wafer W") to which the method MT is applied. The wafer W shown in FIG. 2 includes a substrate SB, an etching target layer EL, an organic film OL, an anti-reflection film BA, and a mask MK.

The etching target layer EL is formed on the substrate SB. The etching target layer EL is a silicon-containing layer, e.g., an amorphous silicon layer or a polycrystalline silicon layer. The organic film OL is made of an organic material and formed on the etching target layer EL. The anti-reflection film BA is a Si-containing anti-reflection film. The anti-reflection film BA is formed on the organic film OL. The mask MK is made of an organic material and is, e.g., a resist mask. The mask MK has a pattern with an opening, which is formed by photolithography.

Figure 3:
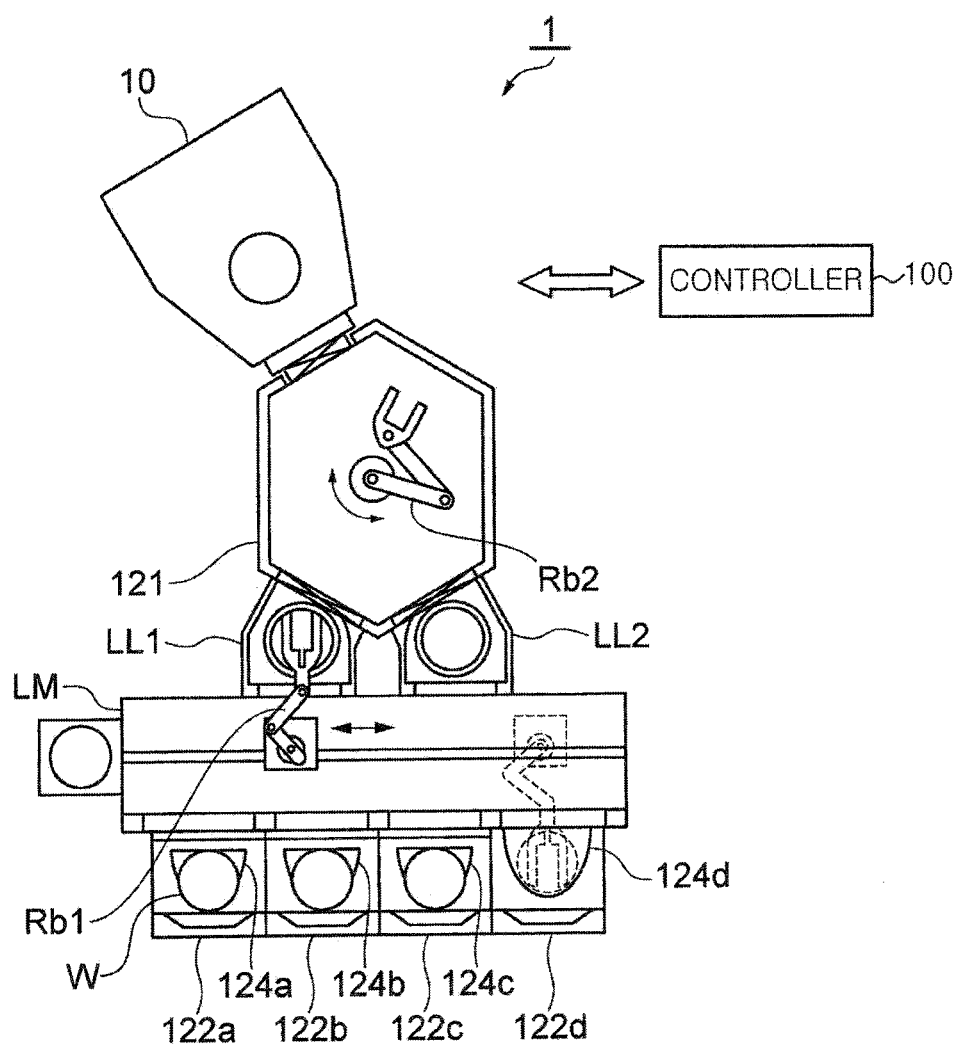
FIG. 3 shows an example of a processing system that can be used for implementing the plasma processing method shown in FIG. 1.

Referring back to FIG. 1, in a step ST1 of the method MT, a wafer W is loaded into a processing chamber of a plasma processing apparatus. FIG. 3 shows an example of a processing system that can be used for implementing the method MT. The processing system 1 shown in FIG. 3 includes stages 122a to 122d, accommodating containers 124a to 124d, a loader module LM, load-lock chambers LL1 and LL2, a transfer chamber 121, and a plasma processing apparatus 10.

The stages 122a to 122d are arranged along one side of the loader module LM. The accommodating containers 124a to 124d are provided on the stages 122a to 122d, respectively. Wafers W are accommodated in the accommodating containers 124a to 124d.

A transfer robot Rb1 is provided in the loader module LM. The transfer robot Rb1 unloads a wafer W accommodated in one of the accommodating containers 124a to 124d and transfers the wafer W to the load-lock chamber LL1 or LL2.

The load-lock chambers LL1 and LL2 are arranged along another side of the loader module LM and connected to the loader module LM. The load-lock chambers LL1 and LL2 serve as preliminary depressurized chambers. The load-lock chambers LL1 and LL2 are connected to the transfer chamber 121.

The transfer chamber 121 is depressurizable. A transfer robot Rb2 is provided in the transfer chamber 121. The plasma processing apparatus 10 is connected to the transfer chamber 121. The transfer robot Rb2 unloads a wafer W from the load-lock chamber LL1 or LL2 and transfers the wafer W to the plasma processing apparatus 10.

The processing system 1 further includes a controller 100. The controller 100 controls each component of the processing system to execute each step of the method MT. In the present embodiment, the controller 100 may be a computer including a processor, a storage unit, an input unit, a display unit and the like. In the present embodiment, the controller 100 stores in the storage unit a program for controlling each component of the processing system 1 in each step of the method MT and controls each component of the processing system 1, e.g., the transfer robots Rb1 and Rb2 and each component of the plasma processing apparatus 10, by executing the program.

Figure 4:
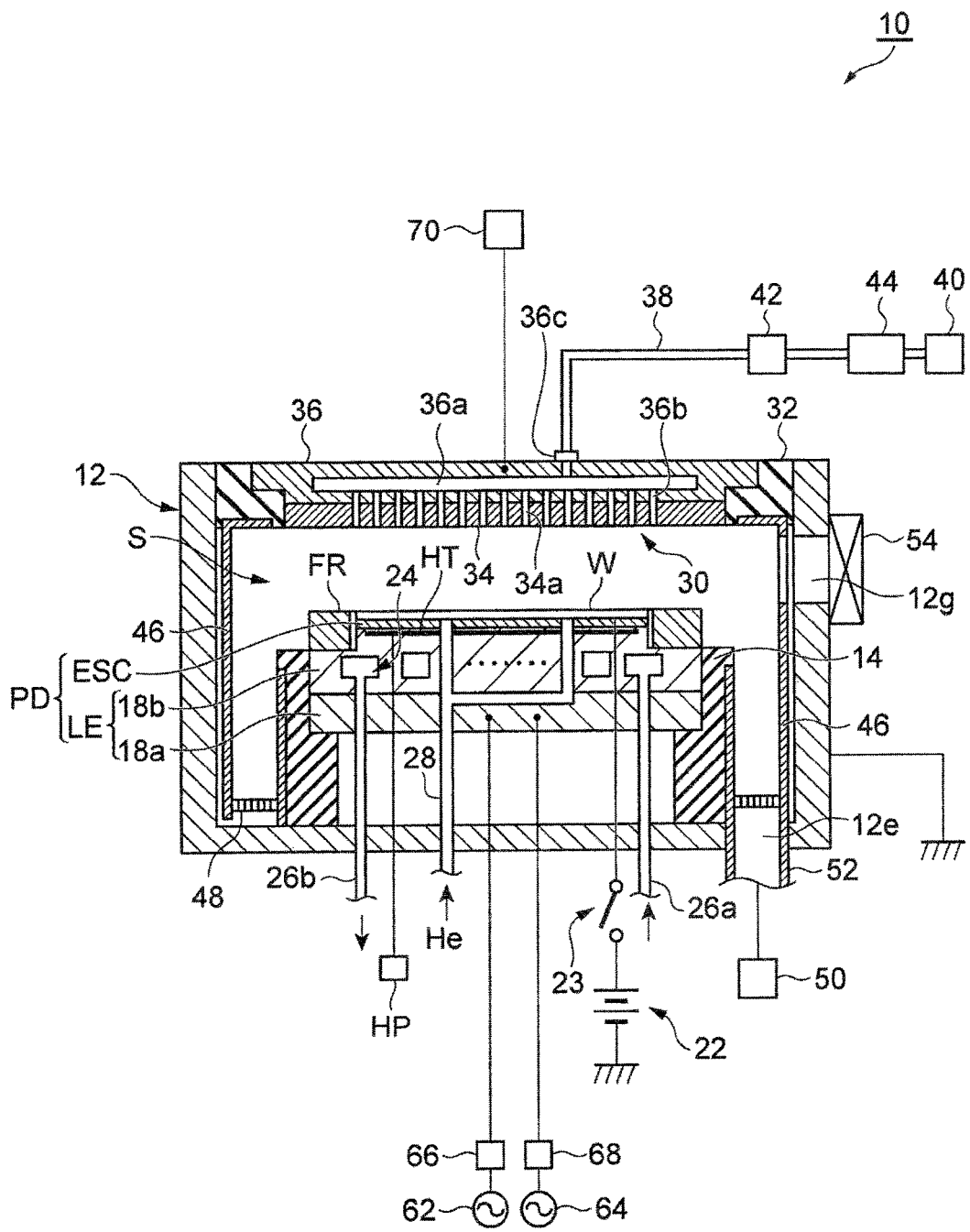
FIG. 4 schematically shows a plasma processing apparatus of the processing system shown in FIG. 3.

FIG. 4 schematically shows the plasma processing apparatus of the processing system shown in FIG. 3. The plasma processing apparatus 10 shown in FIG. 4 is a capacitively coupled plasma etching apparatus and includes a processing chamber 12. The processing chamber 12 has a substantially cylindrical shape. The processing chamber 12 is made of, e.g., aluminum. The processing chamber 12 is frame grounded.

A substantially cylindrical supporting part 14 is provided on a bottom portion of the processing chamber 12. The supporting part 14 is provided in the processing chamber 12 and extends vertically from the bottom portion of the processing chamber 12. A mounting table PD is provided in the processing chamber 12. The supporting part 14 supports the mounting table PD.

A wafer W is held on a top surface of the mounting table PD. The mounting table PD includes a lower electrode LE and an electrostatic chuck ESC. The lower electrode LE has a first plate 18a and a second plate 18b. The first plate 18a and the second plate 18b are made of a metal, e.g., aluminum, and have a substantially disc shape. The second plate 18b is provided on the first plate 18a and electrically connected to the first plate 18a.

The electrostatic chuck ESC is provided on the second plate 18b. The electrostatic chuck ESC has a structure in which an electrode made of a conductive film is interposed between a pair of insulating layers or insulating sheets. A DC power supply 22 is electrically connected to the electrode of the electrostatic chuck ESC via a switch 23. The wafer W is attracted and held on the electrostatic chuck ESC by an electrostatic force such as Coulomb force generated by a DC voltage applied from the DC power supply 22. Accordingly, the wafer W can be held on the electrostatic chuck ESC.

A focus ring FR is provided on a peripheral portion of the second plate 18b to surround the edge of the wafer W and the electrostatic chuck ESC. The focus ring FR is provided to improve the uniformity of the etching. The focus ring FR is made of a material that is appropriately selected depending on a material of an etching target film. For example, the focus ring FR may be made of silicon.

A coolant path 24 is provided in the second plate 18b. The coolant path 24 forms a temperature control unit. A coolant is supplied to the coolant path 24 from an external chiller unit through a line 26a. The coolant flowing in the coolant path 24 returns to the chiller unit through a line 26b. In other words, the coolant is supplied and circulated in the coolant path 24. A temperature of the wafer W held on the electrostatic chuck ESC is controlled by controlling a temperature of the coolant.

The plasma processing apparatus 10 further includes a gas supply line 28. A heat transfer gas, e.g., He gas, from a heat transfer gas supply unit is supplied through the gas supply line 28 to a gap between a top surface of the electrostatic chuck ESC and a backside of the wafer W.

The plasma processing apparatus 10 further includes a heater HT serving as a heating element. The heater HT is buried in, e.g., the second plate 18b. A heater power supply HP is connected to the heater HT. By supplying power from the heater power supply HP to the heater HT, a temperature of the mounting table PD is controlled and, hence, a temperature of the wafer W mounted on the mounting table PD is controlled. The heater HT may be buried in the electrostatic chuck ESC.

The plasma processing apparatus 10 further includes an upper electrode 30. The upper electrode 30 is provided above the mounting table PD to face the mounting table PD. The upper electrode 30 and the lower electrode LE are substantially parallel to each other. Between the upper electrode 30 and the lower electrode LE, a space S where plasma processing is performed on the wafer W is provided.

The upper electrode 30 is held at an upper portion of the processing chamber 12 through an insulating shield member 32. The upper electrode 30 may include a ceiling member 34 and an electrode holding body 36. The ceiling member 34 is a plate-shaped member made of silicon. The ceiling member 34 is provided above the mounting table PD to face the space S. The ceiling member 34 has a plurality of gas injection openings 34a.

The electrode holding body 36 detachably holds the ceiling member 34 and is made of a conductive material, e.g., aluminum. The electrode holding body 36 may have a water cooling structure. A gas diffusion space 36a is provided in the electrode holding body 36. A plurality of gas holes 36b communicating with the gas injection openings 34a extends downward from the gas diffusion space 36a. Further, the electrode holding body 36 includes a gas inlet port 36c for guiding a processing gas into the gas diffusion space 36a. A gas supply line 38 is connected to the gas inlet port 36c.

A gas source group 40 is connected to the gas supply line 38 through a valve group 42 and a flow rate controller group 44. The gas source group 40 includes a plurality of gas sources. The gas sources include a chlorine gas ($Cl_2$ gas) source, an oxygen gas ($O_2$ gas) source, a rare gas source, a hydrogen gas ($H_2$ gas) source, a nitrogen gas ($N_2$ gas) source, and a fluorocarbon gas source. The rare gas may be randomly selected. For example, it may be Ar gas. The fluorocarbon gas may be any gas expressed by $C_xF_y$, e.g., $C_4F_8$ gas.

The valve group 42 includes a plurality of valves. The flow rate controller group 44 includes a plurality of flow rate controllers such as mass flow controllers or pressure-control type flow rate controllers. The gas sources of the gas source group 40 are connected to the gas supply line 38 via corresponding valves of the valve group 42 and corresponding flow rate controllers of the flow rate controller group 44.

In the plasma processing apparatus 10, a deposition shield 46 is detachably provided along an inner wall of the processing chamber 12. The deposition shield 46 is also provided at an outer periphery of the supporting part 14. The deposition shield 46 prevents an etching by-product (deposit) from being adhered to the processing chamber 12.

At the bottom portion of the processing chamber 12, a gas exhaust plate 48 is provided between the supporting part 14 and the inner wall of the processing chamber 12. The gas exhaust plate 48 has a plurality of holes for communication between a space above the gas exhaust plate and a space below the gas exhaust plate. A processing chamber 12, a gas exhaust port 12e is provided below the gas exhaust plate 48. A gas exhaust unit 50 is connected to the gas exhaust port 12e through a gas exhaust line 52. The gas exhaust unit 50 has a vacuum pump such as a turbo molecular pump or the like, so that a pressure in the space in the processing chamber 12 can be decreased to a predetermined vacuum level. A loading/unloading port 12g for a wafer W is provided at the sidewall of the processing chamber 12. The loading/unloading port 12g can be opened and closed by a gate valve 54.

The plasma processing apparatus 10 further includes a first high frequency power supply 62 and a second high frequency power supply 64. The first high frequency power supply 62 generates a first high frequency power for plasma generation. The first high frequency power has a frequency in a range from 27 MHz to 100 MHz and, e.g., a frequency of 60 MHz. The first high frequency power supply 62 is connected to the lower electrode LE via a matching unit 66. The matching unit 66 is a circuit for matching an input impedance of a load side (lower electrode LE side) and an output impedance of the first high frequency power supply 62.

The second high frequency power supply 64 generates a second high frequency power for ion attraction, i.e., a high frequency bias power. The second high frequency power has a frequency in a range from 400 kHz to 13.56 MHz and, e.g., a frequency of 400 kHz. The second high frequency power supply 64 is connected to the lower electrode LE via a matching unit 68. The matching unit 68 is a circuit for matching an input impedance of a load side (lower electrode LE side) and an output impedance of the second high frequency power supply 64.

The plasma processing apparatus 10 further includes a power supply 70. The power supply 70 is connected to the upper electrode 30. The power supply 70 applies to the upper electrode 30 a voltage for attracting positive ions in the space S to the ceiling member 34. In this embodiment, the power supply 70 is a DC power supply for generating a negative DC voltage. In another embodiment, the power supply 70 may be an AC power supply for generating an AC voltage of a relatively low frequency. The voltage applied from the power supply 70 to the upper electrode may be, e.g., about −150V or less. In other words, the voltage applied from the power supply 70 to the upper electrode 30 may be a negative voltage having an absolute value of 150V or above. When such a voltage is applied from the power supply 70 to the upper electrode 30, the positive ions in the space S collide with the ceiling member 34. Accordingly, secondary electrons and silicon are emitted from the ceiling member 34.

Hereinafter, there will be described in detail with reference to FIG. 1 the method MT implemented by the processing system 1 including the plasma processing apparatus 10 as an example. The method MT may be performed by a processing system different from the processing system 1. Also, such processing system may include a plasma processing apparatus different from the plasma processing apparatus 10 of this embodiment. In the following, FIGS. 5 to 8 will be referred to in addition to FIG. 1. FIGS. 5 to 8 are cross sectional views showing a state of a wafer after execution of each step of the method MT.

In the step ST1 of the method MT, a wafer W is loaded into the processing chamber 12 of the plasma processing apparatus 10 by transferring the wafer W from any one of the accommodating containers 124a to 124d into the processing chamber 12 via the loader module LM, the load-lock chamber LL1 or LL2, and the transfer chamber 121. The wafer W transferred into the processing chamber 12 is mounted on the mounting table PD and held by the electrostatic chuck ESC.

Figure 5:
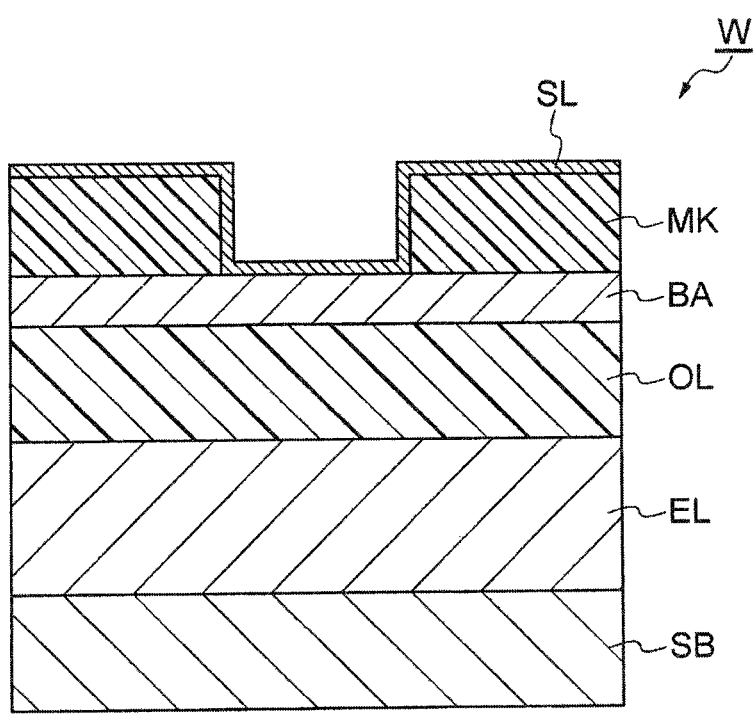
FIGS. 5 to 8 are cross sectional views showing a state of the target object after execution of each step of the plasma processing method shown in FIG. 1.
Figure 6:
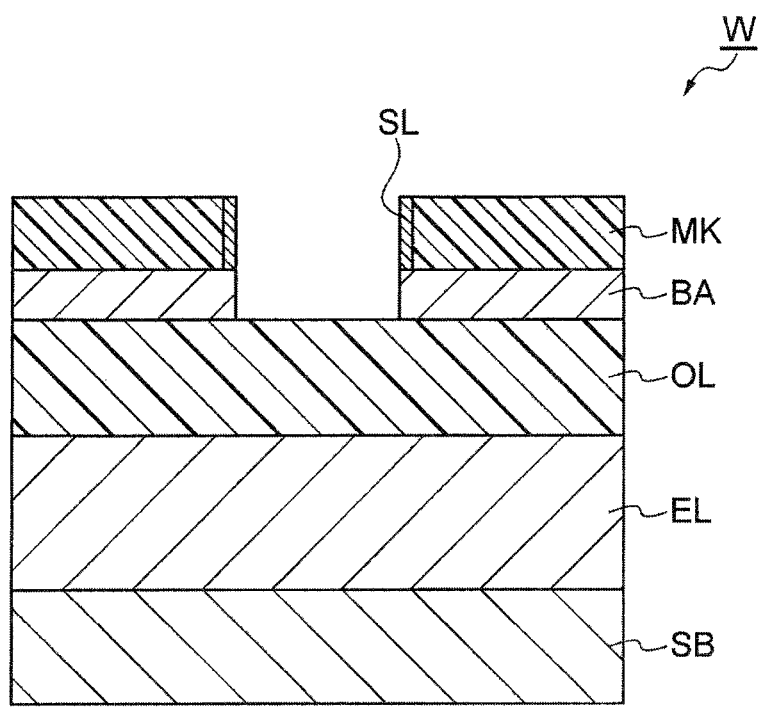
Figure 7:
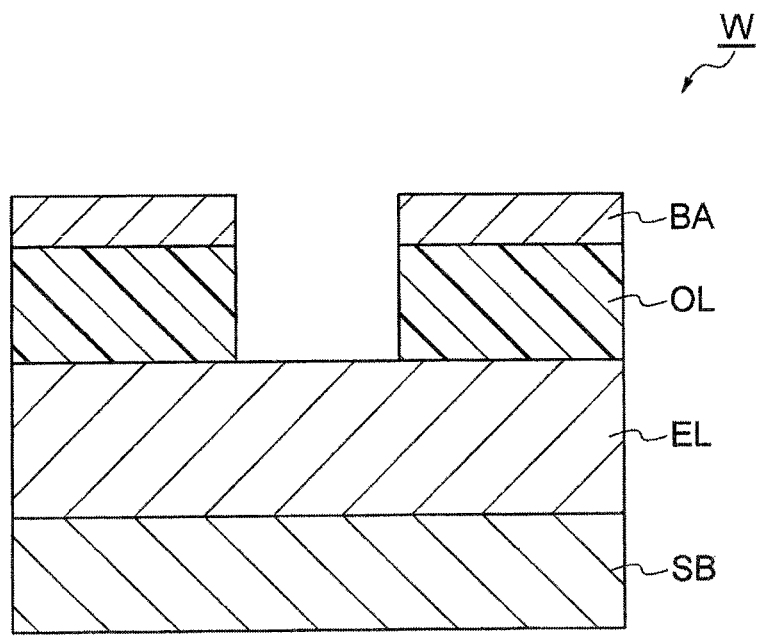
Figure 8:
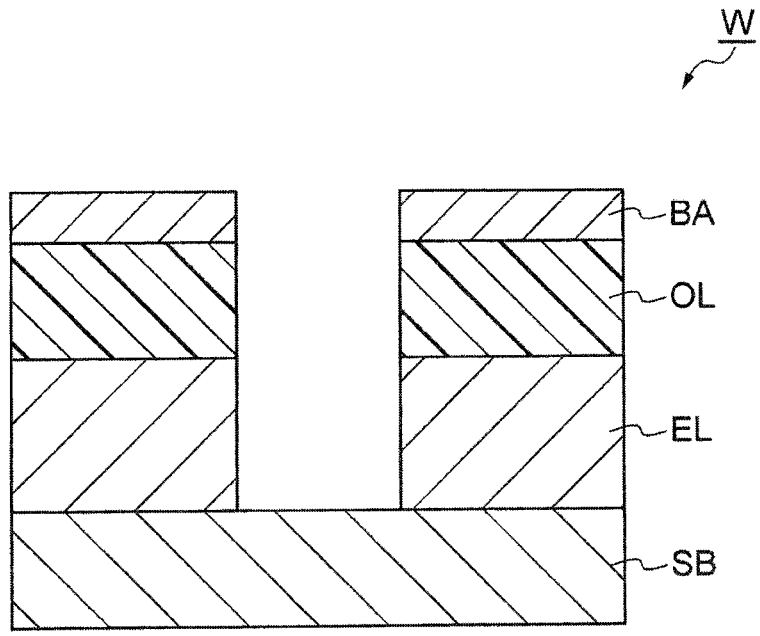

Next, a step ST2 of the method MT of the present embodiment is executed. In the step ST2, positive ions generated in the processing chamber 12 are made to collide with the ceiling member 34, so that secondary electrons and silicon are emitted from the ceiling member 34. In the step ST2, hydrogen gas is supplied from one of the gas sources of the gas source group 40 into the processing chamber 12, and a high frequency power is applied from the first high frequency power supply 62 to the lower electrode LE. Accordingly, positive ions are generated in the processing chamber 12. In the step ST2, a voltage is applied from the power supply 70 to the upper electrode 30, so that the positive ions are attracted to the ceiling member 34 and collide with the ceiling member 34. As a consequence, the secondary electrons are emitted from the ceiling member 34. The mask MK is modified and hardened by the emitted secondary electrons. The silicon emitted from the ceiling member 34 is deposited on the surface of the wafer W to form a film SL as shown in FIG. 5. The film SL protects the mask MK. The dimension of the mask MK, e.g., the width of the opening formed in the mask MK, is adjusted by the film SL.

Next, a step ST3 of the method MT of the present embodiment is executed. In the step ST3, the anti-reflection film BA is etched. In the step ST3, fluorocarbon gas is supplied from one of the gas sources of the gas source group 40 into the processing chamber 12. In the step ST3, oxygen gas and a rare gas may be additionally supplied into the processing chamber 12 from two of the gas sources of the gas source group 40. The high frequency power is applied from the first high frequency power supply 62 to the lower electrode LE. The high frequency bias power is applied from the second high frequency power supply 64 to the lower electrode LE. Accordingly, a plasma is generated in the processing chamber 12, and the anti-reflection film BA is etched by active species of fluorocarbon. As a result, the anti-reflection film BA is removed at a portion exposed through the opening formed in the mask MK, as can be seen from FIG. 6. The etching of the step ST3 is anisotropic. Therefore, the film SL is removed from the top surface of the mask MK and the surface of the anti-reflection film BA and remains only at a region extending along the side surface of the mask MK.

Next, a step ST4 of the method MT of the present embodiment is executed. In the step ST4, the organic film OL is etched. In the step ST4, hydrogen gas and nitrogen gas are supplied into the processing chamber 12 from two of the gas sources of the gas source group 40. The high frequency power is applied from the first high frequency power supply 62 to the lower electrode LE. The high frequency bias power is applied from the second high frequency power supply 64 to the lower electrode LE. Accordingly, a plasma is generated in the processing chamber 12 and the organic film OL is etched by active species of hydrogen. As a result, the organic film OL is removed at a portion exposed through the opening formed in the anti-reflection film BA, as can be seen from FIG. 7. In the step ST4, the mask MK is also removed and the film SL is removed together with the mask MK.

Next, in a step ST5, a plasma of the processing gas is generated in order to etch the etching target layer EL. Specifically, in the step ST5, chlorine gas and oxygen gas are supplied into the processing chamber 12 from two of the gas sources of the gas source group 40. The processing gas may contain other gases such as HBr. The high frequency power is applied from the first high frequency power supply 62 to the lower electrode LE. The high frequency bias power is applied from the second high frequency power supply 64 to the lower electrode LE. Accordingly, a plasma is generated in the processing chamber 12 and the etching target layer EL is etched by active species of chlorine. As a result, the etching target layer EL is removed at a portion exposed through the opening formed in the anti-reflection film BA and the organic film OL, as can be seen from FIG. 8.

Figure 9:
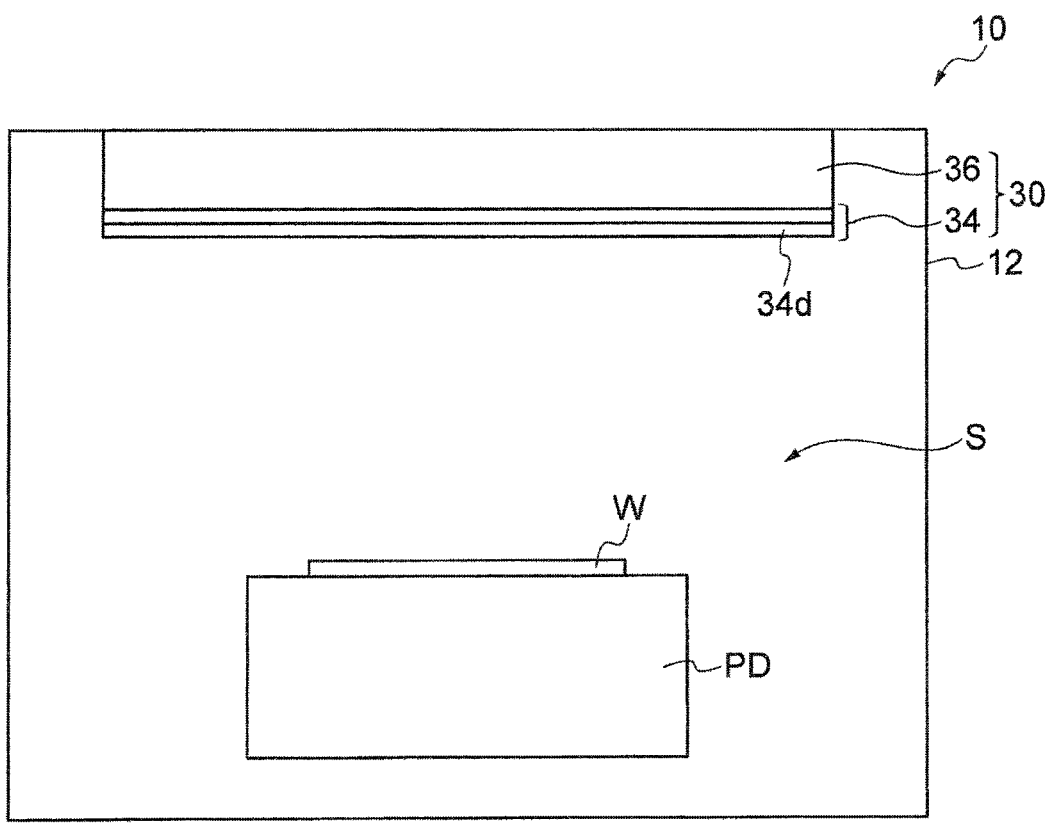
FIG. 9 schematically shows a state of the plasma processing apparatus after execution of a step ST5 of the plasma processing method.

FIG. 9 schematically shows a state of the plasma processing apparatus after the execution of the step ST5. As described above, the processing gas used in the step ST5 contains oxygen gas in addition to chlorine gas. By executing the step ST5, a portion of the ceiling member 34 including its surface is oxidized, thereby forming an oxidized region 34*d*, as can be seen from FIG. 9. The oxidized region 34*d* protects the ceiling member 34 from the etching by active species of chlorine during the execution of the step ST5. As a result, the etching of the ceiling member 34 is suppressed.

Further, in the step ST5 of the present embodiment, a flow rate of the oxygen gas in the processing gas is set to be 0.75 times or more of a flow rate of the chlorine gas in the processing gas. By using the processing gas containing the oxygen gas and the chlorine gas having such flow rates, the thickness of the oxidized region 34*d* formed in the step ST5 is reduced.

Next, a step ST6 of the method MT is executed. In the step ST6, the wafer W is unloaded from the processing chamber 12. For example, the wafer W is transferred from the processing chamber 12 to the transfer chamber 121 and then to one of the accommodating containers 124*a* to 124*d* via the load-lock chamber LL1 or LL2 and the loader module LM.

In the method MT of the present embodiment, a first to a third cleaning process are respectively performed in steps ST7 to ST9. In the first cleaning of the step ST7, a cleaning gas is supplied into the processing chamber 12 in a state where no wafer is accommodated in the processing chamber 12 of the plasma processing apparatus 10. The cleaning gas contains oxygen gas supplied from one of the gas sources of the gas source group 40. In this embodiment, the cleaning gas contains only oxygen gas. The high frequency power is applied from the first high frequency power supply 62 to the lower electrode LE. Accordingly, the plasma of the oxygen gas is generated in the processing chamber 12 and surfaces of members in contact with the space S in the processing chamber 12 are cleaned by active species of oxygen. In the step ST7, a certain region including the surface of the ceiling member 34 is oxidized on its surface or the like.

Next, in the second cleaning process of the step ST8, a dummy wafer is loaded into the processing chamber 12 of the plasma processing apparatus 10 and mounted on the mounting table PD. The dummy wafer is mounted on a top surface of the electrostatic chuck ESC during the cleaning of the plasma processing apparatus 10 and protects the electrostatic chuck ESC. In the second cleaning process of the step ST8, fluorocarbon gas is supplied into the processing chamber 12 from one of the gas sources of the gas source group 40. In the step ST8, a rare gas may be additionally supplied into the processing chamber 12 from one of the gas sources of the gas source group 40. The high frequency power is applied from the first high frequency power supply 62 to the lower electrode LE. Accordingly, a plasma is generated in the processing chamber 12 and the surfaces of the members in contact with the space S in the processing chamber 12 is cleaned by active species of fluorocarbon. Upon completion of the execution of the step ST8, the dummy wafer is unloaded from the processing chamber 12.

Next, in the third cleaning process of the step ST9, the same process as that of the step ST7 is carried out.

In the method MT of the present embodiment, whether or not all the wafers W have been processed is determined in a next step STa. If an unprocessed wafer W, i.e., another wafer W exists, the processes from the step ST1 are started again for the corresponding wafer W. On the other hand, if all the wafers have been processed, the execution of the method MT is completed.

As described above, in the method MT of the present embodiment, the oxidized region 34*d* is formed at the ceiling member 34 during the plasma processing of the step ST5 and the cleaning processes of the steps ST7 and ST9. In order to make positive ions collide with silicon of the ceiling member 34, i.e., a silicon region covered by the oxidized region 34*d* in the step ST2, it is preferable that the thickness of the oxidized region 34*d* is thin. Therefore, in the step ST5 of the present embodiment, the flow rate of oxygen gas in the processing gas is set to be 0.75 times or more of the flow rate of chlorine gas in the processing gas. Accordingly, the thickness of the oxidized region 34*d* formed in the step ST5 can be reduced. As a result, the thickness of the oxidized region 34*d* of the ceiling member 34 immediately before the execution of the step ST2 can be reduced.

Hereinafter, a test in which the flow rate of the oxygen gas in the processing gas is set to different values in the step ST5 will be described. In the test, the step ST5 was executed while setting the flow rate of the chlorine gas in the processing gas to 100 sccm and the flow rate of the oxygen gas in the processing gas to six different values, i.e., 0 sccm, 25 sccm, 50 sccm, 75 sccm, 100 sccm, and 150 sccm. Then, the thickness of the oxidized region 34*d* formed at the ceiling member 34 was measured. Other processing conditions in the test were set as follows.

<Processing Condition>

High frequency power of the first high frequency power supply: 300 W

High frequency power of the second high frequency power supply 64: 100 W

Pressure in the processing chamber 12: 20 mTorr (2.666 Pa)

Processing time: 60 sec

According to the test result, when the flow rate of the oxygen gas in the processing gas was set to 25 sccm, 50 sccm, 75 sccm, 100 sccm, and 150 sccm, the thickness of the oxidized region 34*d* was 34.9 nm, 32.5 nm, 15.9 nm, 8.7 nm, and 9.1 nm, respectively. When the flow rate of the oxygen gas in the processing gas was set to 0 sccm, the surface of the ceiling member 34 was etched considerably. The test result shows that the thickness of the oxidized region 34*d* which was measured when the flow rate of the oxygen gas was 75 sccm or above was smaller than half of the thickness of the oxidized region 34*d* which was measured when the flow rate of the oxygen gas was 50 sccm or less. Therefore, it has been found that, the thickness of the oxidized region 34*d* can be considerably reduced by setting in the step ST5 the flow rate of the oxygen gas in the processing gas to be 0.75 times or more of the flow rate of the chlorine gas in the processing gas.

Although various embodiments have been described, the disclosure is not limited to the above embodiments and may be variously modified. For example, the plasma processing apparatus 10 is configured to apply the high frequency power from the first high frequency power supply 62 to the lower electrode LE. However, it may be configured to apply a high frequency power from the first high frequency power supply 62 to the upper electrode 30. In other words, the first high frequency power supply 62 may be connected to the upper electrode 30.

The plasma processing apparatus used for implementing the method MT is not limited to the plasma processing apparatus 10, and may be any plasma processing apparatus as long as it includes a processing chamber, a mounting table for supporting a target object, and a silicon ceiling member provided above the mounting table. For example, a plasma processing apparatus used for implementing the method MT may be an inductively coupled plasma processing apparatus, or a plasma processing apparatus for exciting a processing gas by using a surface wave such as a microwave.

While the disclosure has been shown and described with respect to the embodiments, it will be understood by those skilled in the art that various changes and modifications may be made without departing from the scope of the disclosure as defined in the following claims.

What is claimed is:

1. A plasma processing method performed in a parallel plate type plasma processing apparatus including a processing chamber, a mounting table provided in the processing chamber and configured to support a target object, an upper electrode including a ceiling member made of silicon and provided above the mounting table, and a lower electrode parallel to the upper electrode and provided in the mounting table, the plasma processing method comprising:
    loading the target object into the processing chamber of the parallel plate type plasma processing apparatus, wherein the target object includes a silicon layer and a resist mask formed over the silicon layer;
    making positive ions generated in the processing chamber collide with the ceiling member of the parallel plate type plasma processing apparatus by applying a voltage to the ceiling member, wherein by said making, the resist mask is modified and hardened by secondary electrons emitted from the ceiling member and a film is formed on the resist mask by the silicon emitted from the ceiling member; and
    generating a plasma of a processing gas containing a chlorine and oxygen gas mixture in the processing chamber to thereby etch the silicon layer, wherein an oxidized region is formed on the ceiling member by said generating the plasma, and wherein a flow rate of the oxygen gas in the processing gas is set to be not less than 0.75 times a flow rate of the chlorine gas in the processing gas.

2. The plasma processing method of claim 1, further comprising, after said generating the plasma of the processing gas:
    unloading the target object from the processing chamber;
    cleaning an inside of the processing chamber;
    loading another target object into the processing chamber; and
    performing said making the positive ions collide with the ceiling member and said generating the plasma of the processing gas again.

3. The plasma processing method of claim 2, wherein said cleaning includes:
    generating a plasma of a cleaning gas consisting of oxygen gas in the processing chamber;
    loading a dummy wafer into the processing chamber;
    generating a plasma of a cleaning gas containing fluorocarbon gas in the processing chamber;
    unloading the dummy wafer from the processing chamber; and
    performing again said generating the plasma of the cleaning gas consisting of the oxygen gas in the processing chamber.

4. The plasma processing method of claim 1, wherein the target object further includes an anti-reflection film and an organic film, and
    the method further comprises:
    generating a plasma of a processing gas containing fluorocarbon gas in the processing chamber to thereby etch the anti-reflection film; and
    generating a plasma of a processing gas containing hydrogen gas and nitrogen gas to thereby etch the organic film.

5. The plasma processing method of claim 1, wherein the voltage is a DC (Direct Current) voltage.

6. The plasma processing method of claim 1, wherein the voltage is an AC (Alternating Current) voltage.

7. The plasma processing method of claim 1, wherein the processing gas consists of the chlorine and oxygen gas mixture.

* * * * *